US008969197B2

(12) United States Patent
Edelstein et al.

(10) Patent No.: US 8,969,197 B2
(45) Date of Patent: Mar. 3, 2015

(54) COPPER INTERCONNECT STRUCTURE AND ITS FORMATION

(75) Inventors: Daniel C. Edelstein, White Plains, NY (US); Takeshi Nogami, Schenectady, NY (US); Christopher Parks, Poughkeepsie, NY (US); Tsong-Lin Tai, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 13/475,526

(22) Filed: May 18, 2012

(65) Prior Publication Data

US 2013/0307150 A1    Nov. 21, 2013

(51) Int. Cl.
*H01L 21/44*    (2006.01)

(52) U.S. Cl.
USPC ............ 438/658; 438/659; 438/660; 438/663

(58) Field of Classification Search
CPC .................................................. H01I 21/76829
USPC .................................. 438/658, 659, 660, 663
See application file for complete search history.

(56) References Cited

U.S. PATENT DOCUMENTS

| 4,680,854 | A  | * | 7/1987  | Ho et al. ........................ 438/655 |
| 4,704,367 | A  | * | 11/1987 | Alvis et al. .................... 438/659 |
| 6,319,819 | B1 |   | 11/2001 | Besser et al. |
| 6,784,088 | B2 | * | 8/2004  | Edelstein et al. ............. 438/612 |
| 7,304,384 | B2 |   | 12/2007 | Koike et al. |
| 7,767,583 | B2 | * | 8/2010  | Ramappa et al. ............. 438/705 |
| 8,133,810 | B2 | * | 3/2012  | Yang et al. .................... 438/653 |
| 8,133,813 | B2 |   | 3/2012  | Koike et al. |
| 8,138,604 | B2 | * | 3/2012  | Yang et al. ..................... 257/751 |
| 8,492,289 | B2 | * | 7/2013  | Edelstein et al. ............. 438/762 |
| 2004/0175894 | A1 | * | 9/2004  | Jin et al. ........................ 438/303 |
| 2006/0286791 | A1 | * | 12/2006 | Feng ............................. 438/613 |
| 2007/0178692 | A1 | * | 8/2007  | Catabay et al. ............... 438/638 |
| 2009/0117735 | A1 | * | 5/2009  | Yin et al. ....................... 438/659 |
| 2009/0227087 | A1 | * | 9/2009  | Ramappa et al. ............. 438/460 |
| 2009/0321935 | A1 |   | 12/2009 | O'Brien et al. |
| 2010/0248473 | A1 | * | 9/2010  | Ishizaka et al. ............... 438/659 |

(Continued)

OTHER PUBLICATIONS

Roy G. Gordon, et al., "Chemical Vapor Deposition (CVD) of Manganese Self-Aligned diffusion Barriers for Cu Interconnections in Microelectronics," Materials Research Society's Proceedings of the Advanced Metallization Conference (AMC) 2008, Sep. 23-25, 2008, San Diego, California, U.S.A.

(Continued)

*Primary Examiner* — David Zarneke
(74) *Attorney, Agent, or Firm* — Catherine Ivers

(57) ABSTRACT

A structure with improved electromigration resistance and methods for making the same. A structure having improved electromigration resistance includes a bulk interconnect having a dual layer cap and a dielectric capping layer. The dual layer cap includes a bottom metallic portion and a top metal oxide portion. Preferably the metal oxide portion is MnO or MnSiO and the metallic portion is Mn or CuMn. The structure is created by doping the interconnect with an impurity (Mn in the preferred embodiment), and then creating lattice defects at a top portion of the interconnect. The defects drive increased impurity migration to the top surface of the interconnect. When the dielectric capping layer is formed, a portion reacts with the segregated impurities, thus forming the dual layer cap on the interconnect. Lattice defects at the Cu surface can be created by plasma treatment, ion implantation, a compressive film, or other means.

7 Claims, 5 Drawing Sheets

(56) References Cited

U.S. PATENT DOCUMENTS

| | | |
|---|---|---|
| 2011/0100697 A1 | 5/2011 | Yang et al. |
| 2011/0147804 A1* | 6/2011 | Mehandru et al. ............ 257/255 |
| 2011/0163062 A1 | 7/2011 | Gordon et al. |
| 2011/0180309 A1 | 7/2011 | Edelstein et al. |
| 2011/0221038 A1* | 9/2011 | Mathai et al. ................. 257/608 |
| 2012/0061838 A1* | 3/2012 | Edelstein et al. ............ 257/751 |

OTHER PUBLICATIONS

Jeffrey P. Gambino, et al., "Reliability Challenges for Advanced Copper Interconnects: Electromigration and Time-Dependent Dielectric Breakdown (TDDB)," IEEE Proceedings of 16th International Symposium on the Physical and Failure Analysis of Integrated Circuits (IPFA), 2009, China.

T. Nogami, et al., "High Reliability 32 nm Cu/ULK BEOL Based on PVD CuMn Seed, and its Extendibility," IEEE International Electron Devices Meeting—IEDM, 2010, pp. 33.5.1-33.5.4.

J. Koike, et al, "Cu Alloy Metallization for Self-Forming Barrier Process," IEEE International Interconnect Technology Conference, 2006, pp. 161-163.

Munehiro Tada, et al., "Improving Reliability of Copper Dual-Damascene Interconnects by Impurity Doping and Interface Strengthening," IEEE Transactions on Electron Devices, vol. 54, No. 8, Aug. 2007, pp. 1867-1876.

A. Von Glasow, et al., "The Influence of the SiN Cap Process on the Electromigration and Stressvoiding Performance of Dual Damascene Cu Interconnects," IEEE 41st Annual International Reliability Physics Symposium, Dallas, Texas, 2003, pp. 146-150.

K.-W. Lee, et al., "Effect of Mechanical Strength and Residual Stress of Dielectric Capping Layer on Electromigration Performance in Cu/Low-k Interconnects," IEEE International Electron Devices Meeting, 2004, pp. 957-960.

H. Kudo, et al., "Copper Wiring Encapsulation at Semi-Global Level to Enhance Wiring and Dielectric Reliabilities for Next-Generaion Technology Nodes," IEEE International Interconnect Technology Conference, 2009, pp. 188-190.

H. Kudo, et al., "Ultrathin Barrier Formation Using Combination of Manganese Oxide Encapsulation and Self-Aligned Copper Silicon Nitride Barriers for Copper Wiring in Future LSI Interconnects," IEEE Transaction on Electron Devices, vol. 58, No. 10, Oct. 2011, pp. 3369-3378.

T. Usui, et al., "High Performance Ultra Low-k (k-2.0/keff-2.4)/Cu Dual-Damascene Interconnect Technology with Self-Formed MnSixOy Barrier Layer for 32 nm-node," IEEE International Interconnect Technology Conference 2006, pp. 217-218.

* cited by examiner

COPPER INTERCONNECT STRUCTURE AND ITS FORMATION

FIELD OF THE INVENTION

The present invention generally relates to interconnect structures of microelectronic devices. In particular, the invention relates to methods and structures for improving electromigration resistance by creating defects in interconnects to enhance impurity segregation.

BACKGROUND AND RELATED ART

Electromigration is the migration of metal atoms in a conductor due to an electrical current. The migration of the metal atoms means metal atoms move from a first area to a second area. As a result, the migrating metal atoms leave voids in the first area. Over time, the voids can grow in size which increases the resistance of the interconnect; or the voids can form opens in the interconnects. Either way, the interconnect fails. The time it takes to form voids which cause failure in the interconnect is called the electromigration lifetime. In copper interconnects used in microelectronics, the electromigration lifetime is determined by mass transport at the interface between the copper and a dielectric capping layer. Accordingly, many schemes to improve electromigration resistance aim to improve the adhesion between the dielectric cap and the copper.

One scheme uses a self-aligned CuSiN cap on the top surface of the interconnect; another uses a self-aligned metal cap of CoWP, and others use an alloy seed layer. In the alloy scheme, a dopant (impurity) is introduced in a copper (Cu) seed layer. During subsequent processing the impurity segregates to the dielectric cap/Cu interface to form an impurity-oxide layer. The greater the amount of impurity, the greater the electromigration resistance (i.e. longer electromigration lifetime). However, the impurities increase the resistance of the interconnects. Furthermore, the segregation of impurity to the interface is believed to be limited by the impurity oxide formation. Thus, once all the impurity-oxide is formed, there is no more driving force for impurity segregation and the impurity remains in the bulk copper thereby increasing the interconnect resistance. In addition, as interconnect line widths shrink, a greater amount of impurity is required to increase electromigration lifetime, thus, further exacerbating the resistance increase problem.

Thus, a method and structure for improved electromigration resistance is needed which improves electromigration lifetime without overly increasing the resistance of the copper interconnect. In addition, the method and structure should be scalable to accommodate decreasing interconnect line widths.

SUMMARY

The general principal of the present invention is a method of improving electromigration lifetime, without unduly increasing interconnect resistance, by intentionally creating lattice defects at the surface of copper interconnects. The defects drive impurity (dopant) segregation to that region. Thus, a higher atomic percentage of impurity can be used without increasing the resistance of the interconnect.

In one embodiment an interconnect structure includes a metal oxide portion, a metallic portion, and a bulk conductor portion having a top region. The metallic portion is located at the top region of the bulk conductor and the metal oxide portion is above the metallic portion.

Another embodiment an interconnect structure includes a manganese oxide portion, a metallic manganese portion, and a copper portion having a top region. The metallic manganese portion is located at the top region of the copper, and the manganese oxide portion is above the metallic manganese portion.

An embodiment of a method of forming an interconnect structure with improved electromigration resistance includes forming an opening in a dielectric region on a substrate, forming an impurity containing layer, substantially filling the opening with a bulk conductor, stressing a top region of the bulk conductor or creating defects at a top region of the bulk conductor, and thermally treating the substrate thereby forming an impurity containing oxide layer and a metallic impurity layer at the top region of the bulk conductor.

BRIEF DESCRIPTION OF THE DRAWINGS

Other objects, aspects and advantages of the invention will become obvious in combination with the description of accompanying drawings, wherein the same number represents the same or similar parts in all figures.

DETAILED DESCRIPTION

Figure 1A:
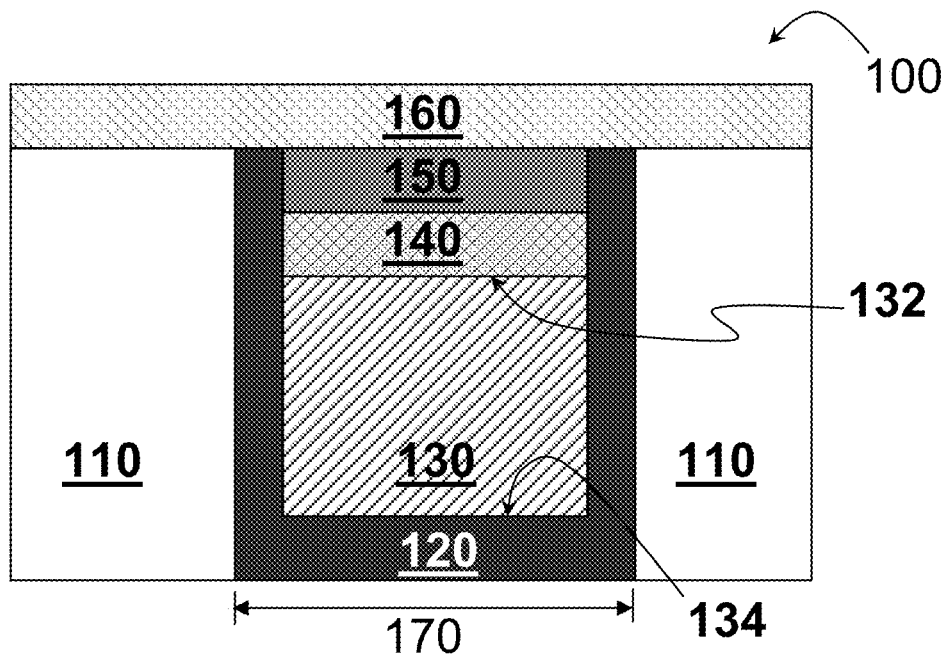
FIG. 1A is cross-section view of an interconnect structure according to an embodiment of the present invention.
Figure 1B:
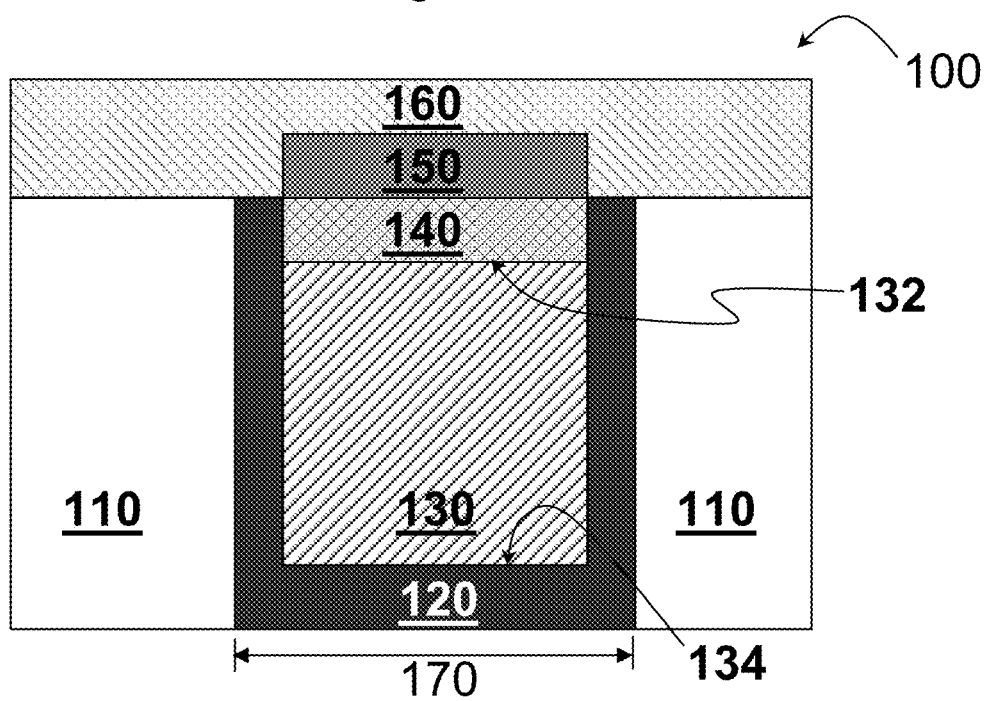
FIG. 1B is cross-section view of another interconnect structure according to an embodiment of the present invention.

Embodiments of an interconnect structure of the present invention are described in conjunction with FIGS. 1A-B. Embodiments of methods to form the interconnect structure of the present invention are described in conjunction with FIGS. 2-3E.

Referring to FIG. 1A, an embodiment of an interconnect structure 100 of the present invention is illustrated. The interconnect structure 100 includes a bulk conductor 130 having top 132 and bottom 134 regions. The interconnect structure 100 is substantially embedded in a dielectric 110. In the embodiment in FIG. 1A, the bulk conductor is surrounded on three sides by a liner 120. In other embodiments, there may be no liner 120, a liner 120 only on the sidewalls, or only a portion of the liner 120 on the bottom region 134 of the bulk conductor 130. At the top region 132 of the bulk conductor 130 is a metallic portion 140. Above the metallic portion 140 is a metal oxide portion 150. In the preferred embodiment of FIG. 1A, both the metallic portion 140 and metal oxide portion 150 have liner 120 on two sides. Thus, in the preferred embodiment the interconnect comprises a bulk conductor 130, having a dual layer (metallic portion 140, and metal oxide portion 150) at a top region 132, all surrounded by liner 120 in a dielectric 110 opening such that the liner 120, metal oxide portion 150 and dielectric 110 are substantially co-planar. FIG. 1A also illustrates a capping layer 160 above the dielectric 110, liner 120 and metal oxide portion 150. In a further embodiment shown in FIG. 1B, the dielectric 110, liner 120, and metallic portion 140 are substantially co-planar. Here, the metal oxide portion 150 is above the metallic portion 140, but is not bordered by liner 120. The interconnect structures have an interconnect line width 170.

In a preferred embodiment, the bulk conductor 130 is substantially copper, meaning there can and likely will be impurities in the bulk conductor, but the conductor is mostly copper. The liner 120 can include one or more layers of material. The liner 120 functions to promote adhesion of the bulk conductor 130 and dielectric 110, and/or to prevent copper diffusion from the bulk conductor 130 to the dielectric 110. Liner material can include elements of Groups IVB through VIB of the periodic table of the elements, elements of Group VIIIB, alloys of the bulk conductor, metal oxides and metal nitrides. In a preferred embodiment, the liner 120 includes a tantalum (Ta) layer and a tantalum nitride (TaN) layer. In another preferred embodiment, the liner 120 includes a Ta layer, a TaN layer and a manganese (Mn) containing alloy portion.

In a preferred embodiment the metallic portion 140 is a region that contains a metal impurity (dopant) in a metallic bonding state, as opposed to an oxidized bonding state. Metallic bonding states exist in pure metals, a metal alloy (i.e. a solid solution or mixture of two or more metals), or an intermetallic compound (i.e. there is a fixed stoichiometry). In a preferred embodiment, the metal impurity (dopant) is Mn. In a preferred embodiment, the Mn is in a metallic bonding state because it is alloyed to the bulk conductor 130, preferably, copper. Thus, in the preferred embodiment, the metallic portion 140 is CuMn. Note, that in an earlier description of the bulk conductor 130, it was said that the bulk conductor can have impurities. Mn can be an impurity in the bulk conductor, 130. Thus, in the preferred embodiment, a difference between bulk conductor 130 having a Mn impurity and the metallic portion 140, is that the amount of Mn in the metallic portion 140 is greater than the amount of Mn in the bulk conductor 130. Thus, metallic portion 140 is a portion of the interconnect structure to which the metal impurity (dopant) has preferentially segregated. While the preferred embodiment described one impurity (dopant) in the metallic portion 140, there can be more than one impurity (dopant) in the metallic portion 140. By way of example and not limitation, impurity (dopant) of the metallic portion 140 can include one or more of the following transition or other metal elements: Mn, Al, Ti, Zn, Sn, and In.

The metal oxide portion 150 is a layer including a metal and oxygen. In a preferred embodiment the metal is Mn so the metal oxide portion is MnO. The metal oxide portion 150 can also include elements other than metals and oxygen, for example Si. Thus, another embodiment could be MnSiO.

As shown in FIG. 1A, the metallic portion 140 and metal oxide 150 form a dual layer at the top of the bulk conductor. In a preferred embodiment, the metal of the metal oxide portion 150, and the metal of the metallic portion 140 are the same type of metal, Mn. In a preferred embodiment, the bulk conductor 130 is copper with Mn impurities. In the preferred embodiment, the amount of Mn found in the dual layer is greater than or equal to 60% of the Mn found in the total interconnect structure and ranges there between.

The dielectric 110 can include one or more layers of insulating material. Insulating materials typically include pure or doped silicate glasses; in a preferred embodiment, the doping being fluorine or carbon. The insulating materials can be porous. Preferably, the dielectric 110 has a dielectric constant less than 4.

The capping layer 160 is an insulating material containing nitrogen. In a preferred embodiment the capping layer 160 is SiCN. In another preferred embodiment, the capping layer 160 has a coefficient of thermal expansion which is greater than that of the bulk conductor 130.

An advantage of the dual layer structure described above is that more metal dopant (preferably Mn) can segregate to the top surface of the bulk conductor (preferably copper). The dual layer of the top surface provides a stronger capping layer-to-bulk conductor coupling which blocks copper migration and thus lengthens the electromigration lifetime. The dual layer structure of the metal oxide (MnO or MnSiO, preferably) and metallic portions provides for more incorporation of metal dopant (i.e. impurity) without unduly increasing the resistance of the bulk conductor.

Figure 2:
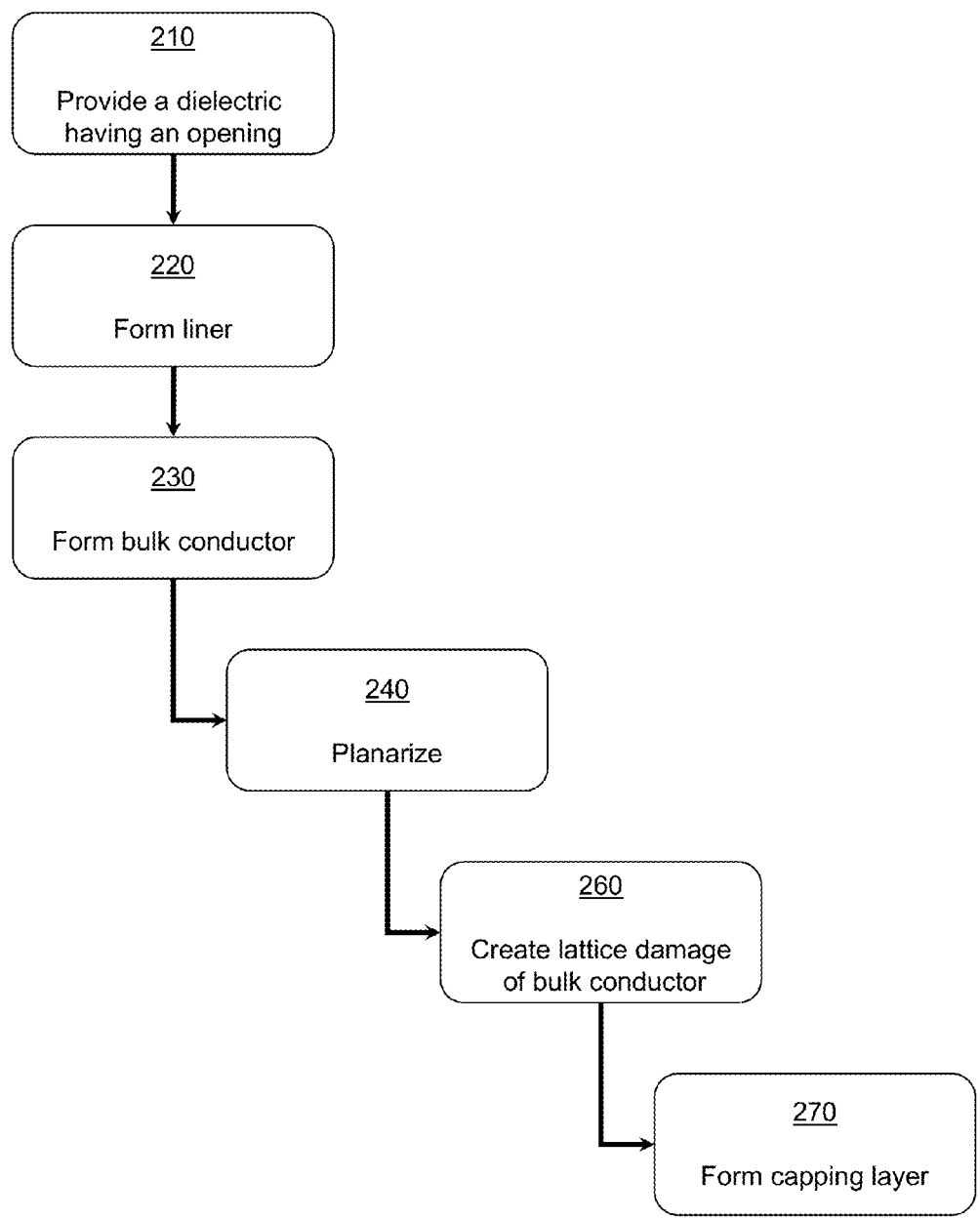
FIG. 2 is a flow chart illustrating an embodiment of a method of creating the dual layer interconnect structure of FIG. 1A.

Referring to FIG. 2, a flow chart of an embodiment of a method of creating the dual layer structure of FIG. 1A is presented. The method includes the following steps: step providing a dielectric having an opening; forming a liner; forming a bulk conductor; polishing the conductor; creating lattice damage in the bulk conductor; and forming a capping layer.

Figure 3A:
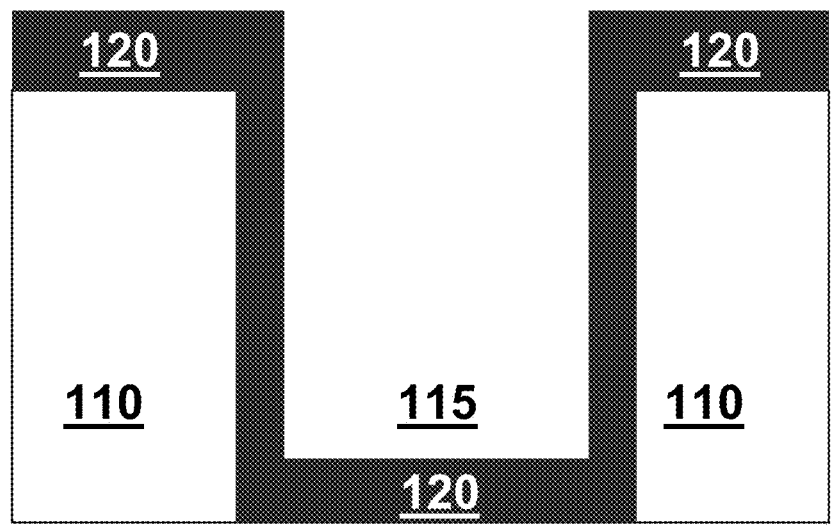
FIG. 3A illustrates a liner formed in an opening in a dielectric according to an embodiment of a method step of the present invention.

Referring to FIG. 3A, a dielectric 110 having an opening 115 is shown. The opening 115 of the dielectric 110 has a liner 120 formed in it. The liner 120, in this embodiment, includes an alloy containing an impurity (dopant). Other layers, in addition to the alloy containing the impurity (dopant), can also be included in the liner 120 as described earlier in conjunction with FIGS. 1A and 1B. The impurity (dopant) of the alloy can include one or more of the following transition or other metal elements: Mn, Al, Ti, Zn, Sn, and In. In a preferred embodiment the impurity is Mn such that the alloy is CuMn. As deposited, the percentage of impurity in the alloy is from about 0.25 atomic percent to about 2.0 atomic percent and ranges there between. Liner 120 layer(s) can be formed by one or more of the following methods: chemical vapor deposition (CVD), atomic layer deposition (ALD), and physical vapor deposition (PVD).

Figure 3B:
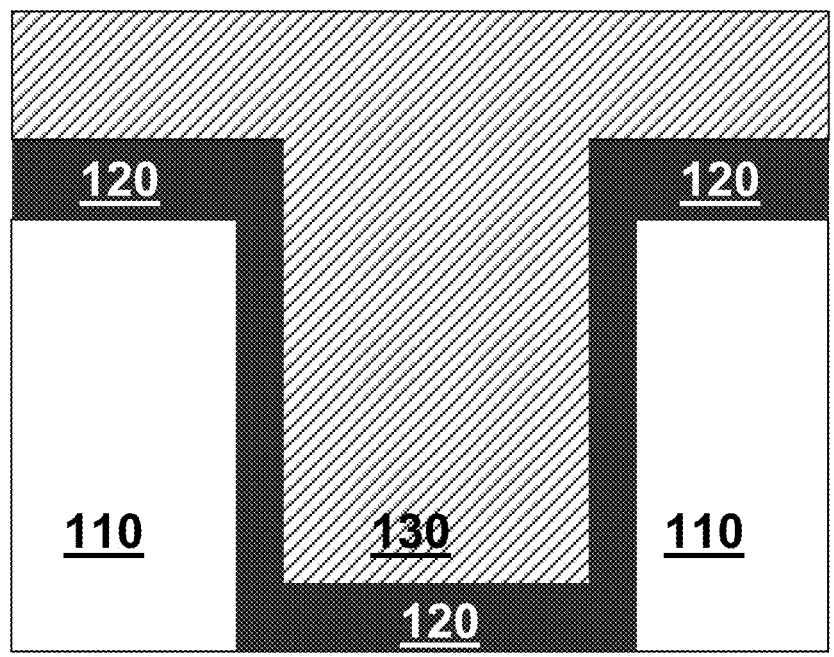
FIG. 3B illustrates a bulk conductor in an opening in a dielectric according to an embodiment of a method step of the present invention.
Figure 3C:
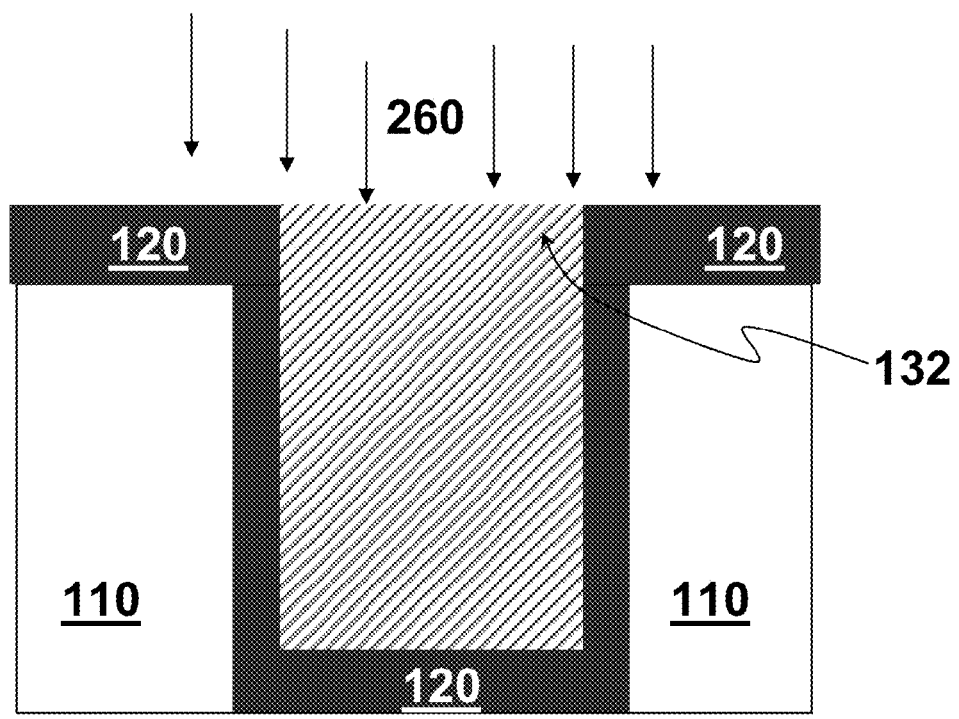
FIG. 3C illustrates creating lattice damage in a top portion of a bulk conductor according to an embodiment of a method step of the present invention.
Figure 3D:
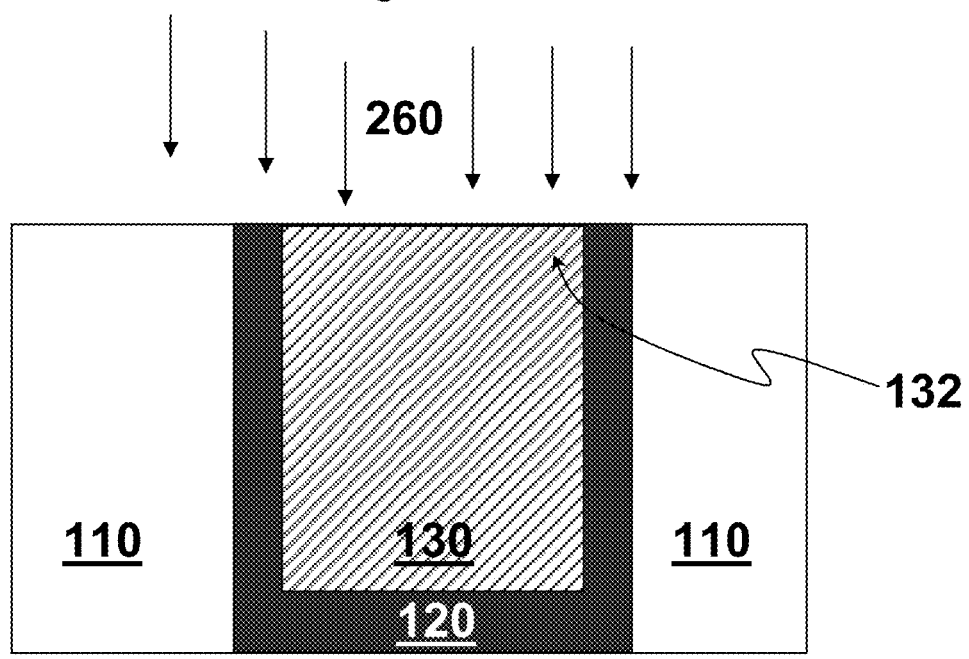
FIG. 3D illustrates creating lattice damage in a top portion of a bulk conductor according to another embodiment of a method step of the present invention.

Referring to FIG. 3B the bulk conductor 130 is formed to fill and overflow the opening 115. Referring to FIGS. 3C and 3D, the bulk conductor 130 is polished to either (1) being coplanar with the liner as in FIG. 3C, or (2) being coplanar with the dielectric 110 as in FIG. 3D. At either point (after bulk conductor polish in FIG. 3C or after liner polish in FIG. 3D), one of the lattice damaging techniques 260, represented by arrows, can be applied.

Lattice damaging techniques 260 include stressing the top region of the bulk conductor and creating defects in the top region of the bulk conductor. Stressing the top of the conductor can be accomplished by forming a capping layer over the bulk conductor which has a lower coefficient of thermal expansion than the bulk conductor. In such a case an excessive compressive stress is formed. Stressing can also be accomplished by forming a dielectric layer and UV curing to cause a compressive stress in the top region of the bulk conductor. Defects can be created by plasma bombardment of the bulk conductor 130 to embed atoms (preferably neutral atoms, for example argon), ion implantation of the bulk conductor 130, deposition of a capping layer with a high initial bias to create damage, and oxidation followed by reduction of the bulk conductor 130. Oxidation can be done by exposing the top region of the bulk conductor to an oxygen containing atmosphere. Reduction can be done by exposing the top region of the bulk conductor to a nitrogen or hydrogen containing environment. One or more of the lattice damaging techniques 260 can be applied to the same structure. The lattice damaging techniques can be preformed in-situ with capping layer 160 formation or can be preformed ex-situ prior to the capping layer 160 formation. The purpose of applying a lattice damaging technique 260 to the bulk conductor 130 is to create lattice defects in the top region of the conductor. The lattice defects will act as impurity (dopant) sinks.

Figure 3E:
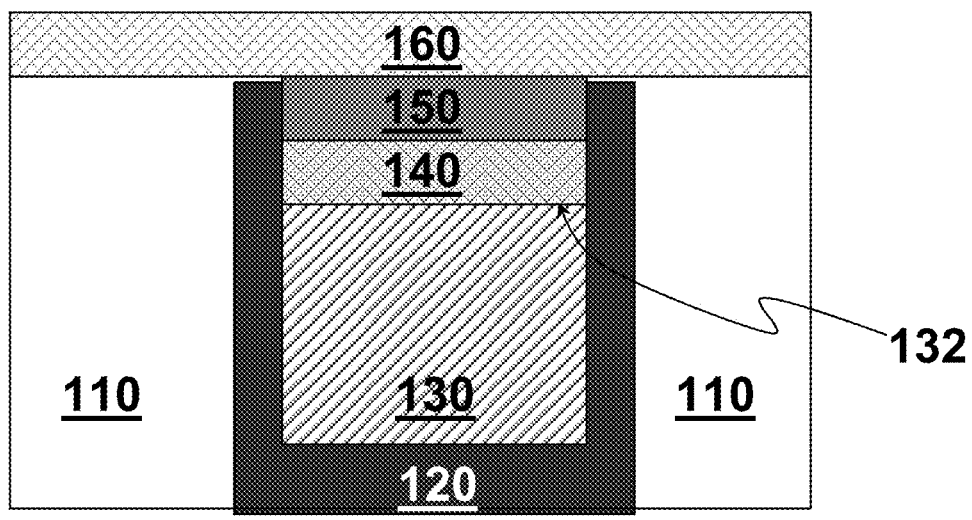
FIG. 3E illustrates forming a capping layer according to an embodiment of a method step of the present invention.

Referring to FIG. 3E, the capping layer 160 is formed. The capping layer is formed by plasma enhanced chemical vapor deposition (PECVD) at a temperature from about 300 C to about 400 C and ranges there-between. The elevated temperature drives impurities from the impurity-containing alloy layer of the liner 120 and/or bulk conductor 130 to the capping layer-bulk conductor interface. At the capping layer-bulk conductor interface, the impurities react with the capping layer to form the metal oxide film 160. Even if the capping layer is SiCN, a metal oxide film 160 will still form because adventitious oxygen from residual partial pressure of H$_2$O in the capping tool vacuum system is typically incorporated at the Cu/cap interface during seasoning and pre-cleaning steps of cap deposition processing. Normally, the driving force for migration of impurities to the capping layer-bulk conductor interface is largely satisfied once the metal oxide 160 is formed. However, the presence of lattice defects at the top of the bulk conductor further drives the migration of impurities to the interface. Thus, the impurities continue to segregate to the top surface 132 of the bulk conductor and a metallic portion 140 is formed. As a result, a reduced amount or no impurities will be found at the liner layer 120.

The additional segregation driving force of lattice defects means that the impurity (dopant) is largely found in the dual layer rather than the bulk conductor 130. As a result, a higher percentage of dopant can be used in the alloy seed layer of liner 120. The higher percentage migrates to the dual layer rather than increasing the resistance of the bulk conductor. Thus, by using these lattice damaging methods to create a dual layer, the electromigration resistance of smaller line widths can be achieved. Here, smaller line widths includes line widths less than about 100 nm to about 30 nm and lower.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. The method of forming an interconnect structure with improved electromigration resistance, the method comprising:

forming an opening in a dielectric region on a substrate;
   forming an impurity containing layer;
   substantially filling the opening with a bulk conductor;
   stressing a top region of the bulk conductor or creating defects at a top region of the bulk conductor; and
   thermally treating the substrate thereby forming an impurity containing oxide layer and a metallic impurity layer at the top region of the bulk conductor.

2. The method of claim 1 wherein stressing the top region of the bulk conductor is by forming a capping layer over the bulk conductor wherein the capping layer has a lower coefficient of thermal expansion than the bulk conductor.

3. The method of claim 1 wherein stressing comprises a forming a dielectric layer and UV curing to cause a compressive stress in the top region of the bulk conductor.

4. The method of claim 1 wherein the top region of the bulk conductor is compressed.

5. The method of claim 1 wherein creating defects comprises ion implanting the top region of the bulk conductor with a noble gas.

6. The method of claim 1 wherein creating defects comprises plasma treating the top region of the bulk conductor.

7. The method of claim 1 wherein creating defects comprises oxidation of the top region of the bulk conductor followed by reduction of the top region.

* * * * *